United States Patent
Park

(10) Patent No.: US 6,850,453 B2
(45) Date of Patent: Feb. 1, 2005

(54) DEEP POWER DOWN CONTROL CIRCUIT

(75) Inventor: Kee Teok Park, Ichon-shi (KR)

(73) Assignee: Hynix Semiconductor Inc., Kyoungki-Do (KR)

(*) Notice: Subject to any disclaimer, the term of this patent is extended or adjusted under 35 U.S.C. 154(b) by 221 days.

(21) Appl. No.: 10/330,579

(22) Filed: Dec. 27, 2002

(65) Prior Publication Data

US 2004/0001386 A1 Jan. 1, 2004

(30) Foreign Application Priority Data

Jun. 29, 2002 (KR) .................................. 10-2002-0037720

(51) Int. Cl.[7] .................................................. G11C 7/00
(52) U.S. Cl. ...................................... 365/227; 365/226
(58) Field of Search ................................ 365/227, 226, 365/228, 233

(56) References Cited

U.S. PATENT DOCUMENTS

| 4,718,043 A | | 1/1988 | Akatsuka |
| 5,197,034 A | * | 3/1993 | Fandrich et al. ............ 365/227 |
| 5,955,913 A | | 9/1999 | Roohparvar |
| 6,510,096 B2 | * | 1/2003 | Choi et al. .................. 365/226 |
| 6,744,687 B2 | * | 6/2004 | Koo et al. ................... 365/226 |

* cited by examiner

Primary Examiner—Anh Phung
(74) Attorney, Agent, or Firm—Marshall, Gerstein & Borun LLP

(57) ABSTRACT

A deep power down control circuit includes a deep power down switch unit to separate an external power voltage line from a selected one of a plurality of internal power voltage lines according to a deep power down signal, a deep power down discharge unit for connecting the plurality of internal power voltage lines to a ground voltage line and to discharge them to a ground voltage level according to the deep power down signal. The deep power down control circuit also includes a deep power down signal generating unit control according to a bank active detect signal and a burst end command, to output the deep power down signal by using a clock enable signal. The deep power down control circuit connects the plurality of internal power voltage lines to the ground voltage line, and thus prevents floating to remove the possibility of inversion of the power voltage or generation of the latch-up. Moreover, the deep power down control circuit prevents leakage current by a micro bridge among the plurality of internal power voltage lines.

12 Claims, 7 Drawing Sheets

DEEP POWER DOWN CONTROL CIRCUIT

TECHNICAL FIELD

The present patent relates to a deep power down control circuit for a semiconductor memory device, and in particular to an improved deep power down control circuit which can cut off a micro bridge generated between internal circuits or between wires by using a deep power down discharge circuit.

BACKGROUND

In general, a semiconductor memory device enables peripheral circuits to store data or externally output the stored data in an active state, and disables unnecessary peripheral circuits in a standby state to minimize power consumption. When the semiconductor memory device is maintained in the standby state for a long time, it enters into a deep power down mode to stop the operation of the peripheral circuits to reduce power consumption.

The deep power down mode is controlled according to an external command in the semiconductor memory device. That is, the semiconductor memory device enters into or ends the deep power down mode according to a state of signals CS, RAS, CAS, WE and CKE input through the memory device's external signal pin after a precharge time tRP from a precharge command. This operation is synchronized with a clock signal.

For example, when the chip select signal CS has a low level, the row address strobe signal RAS has a high level, the column address strobe signal CAS has a high level, the write enable signal WE has a low level and the clock enable signal CKE has a low level, the semiconductor memory device is synchronized by the clock signal CLK to enter into the deep power down mode. And when the clock enable signal CLK is transited to a high level, the semiconductor memory device ends the deep power down mode. When the semiconductor memory device enters into the deep power down mode, it intercepts power of some power circuits to reduce power consumption.

However, the aforementioned method restrictively reduces power consumption, and thus cannot control a specific power circuit which may generate mis-operation. For example, a reference voltage generator or power up circuit is difficult to control. Accordingly, the semiconductor memory device fails to stop the operation of such circuits, but intercepts power of some controllable circuits. As a result, it is difficult to reduce unnecessary power consumption sufficiently. In particular, conventional semiconductor memory devices cannot effectively control a micro bridge generated between internal circuits or between wires.

SUMMARY OF THE DISCLOSURE

A deep power down control circuit is described herein. The disclosed deep power down control circuit reduces unnecessary power consumption by intercepting and discharging a selected one of a plurality of internal power lines. The deep power down control circuit may include: a deep power down switch unit to separate an external power voltage line from the selected one of the plurality of internal power voltage lines according to a deep power down signal; a deep power down discharge units to connect the plurality of internal power voltage lines and discharge them to a ground voltage level according to the deep power down signal; and a deep power down signal generating units, controlled according to a bank active detect signal and a burst end command, to output the deep power down signal by using a clock enable signal.

BRIEF DESCRIPTION OF THE DRAWINGS

The disclosure will be described in terms of several embodiments to illustrate its broad teachings. Reference is also made to the attached drawings.

DETAILED DESCRIPTION

The present disclosure will be described in detail by way of a preferred embodiment with reference to the accompanying drawings.

Figure 1:
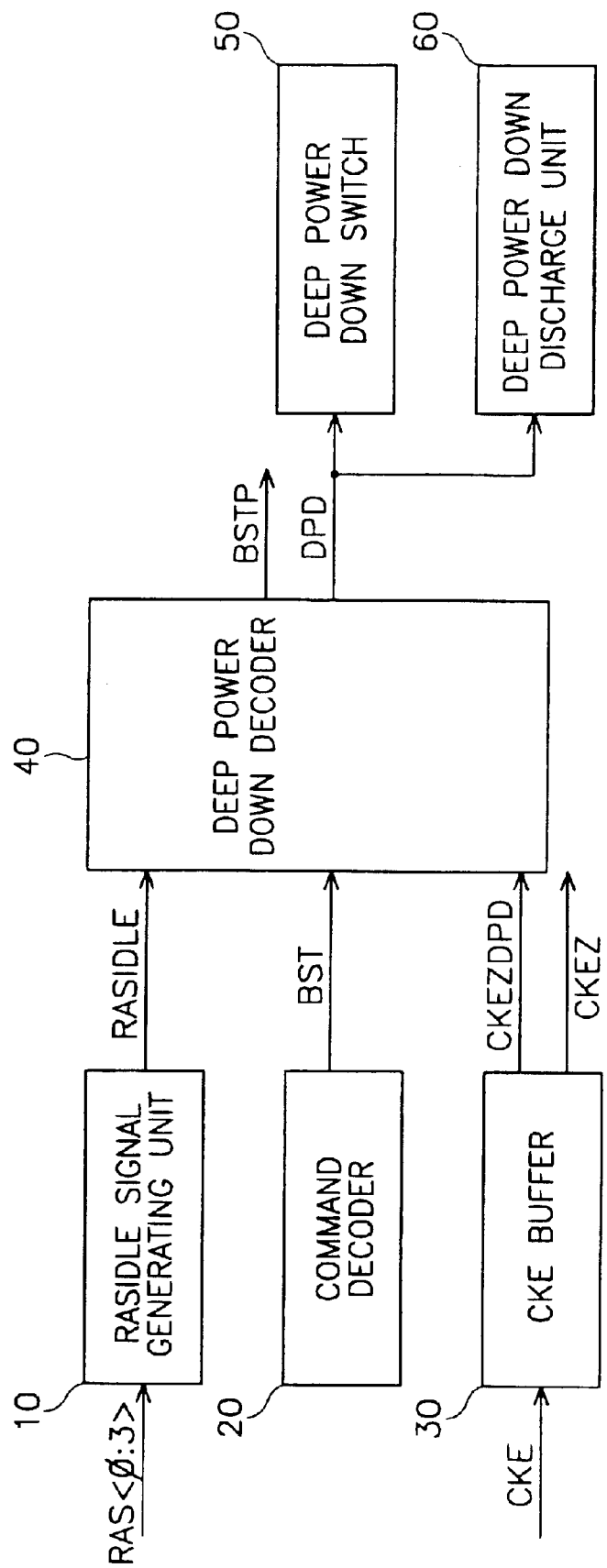
FIG. 1 is a block diagram illustrating a deep power down control circuit.

FIG. 1 is a block diagram illustrating a deep power down control circuit that includes a RASIDLE signal generating unit 10 for generating a state signal RASIDLE that is enabled when all banks are in an idle state, a command decoder 20 for generating a burst end command BST, and a CKE buffer 30 for buffering a clock enable signal CKE. Also included is a deep power down decoder 40 which receives the state signal RASIDLE, the burst end command BST and a deep power down clock enable signal CKEZDPD. The deep power down decoder 40 outputs a burst end signal BSTP in a bank active state, and outputs a deep power down signal DPD when all the banks are in the idle (precharge) state. Further, the deep power down control circuit includes a deep power down switch 50 for selectively intercepting an external voltage pad VDDPAD and an internal power line VPERI according to the deep power down signal DPD. Also included is a deep power down discharge unit 60 for discharging all internal power lines to a ground potential according to the deep power down signal DPD.

Figure 2:
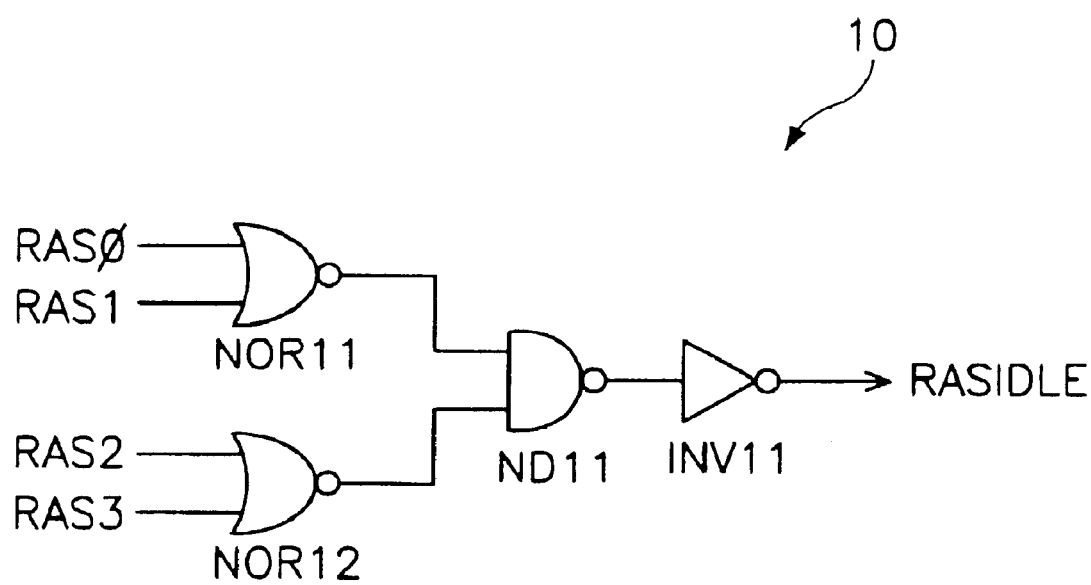
FIG. 2 is a detailed circuit diagram illustrating a RASIDLE signal generating unit of FIG. 1.

Referring to FIG. 2, the RASIDLE signal generating unit 10 includes NOR gates NOR11 and NOR12 for respectively NORing row address strobe signals RAS<0:3> for enabling each bank, a NAND gate ND11 for NANDing the output signals from the NOR gates NOR11 and NOR12, and an inverter INV11 for inverting the output signal from the NAND gate ND11 and outputting the state signal RASIDLE. Here, the NOR gate NOR11 NORs the row address strobe signal RAS<0:1>, and the NOR gate NOR12 NORs the row address strobe signal RAS<2:3>. Although four banks are exemplified, those of ordinary skill in the art will recognize that the circuit can be modified to include a different number of banks. Accordingly, all the row address strobe signals RAS<0:3>have a low level in the idle state where any of the banks is not activated, and thus the state signal RASIDLE is enabled in a high level.

Figure 3:
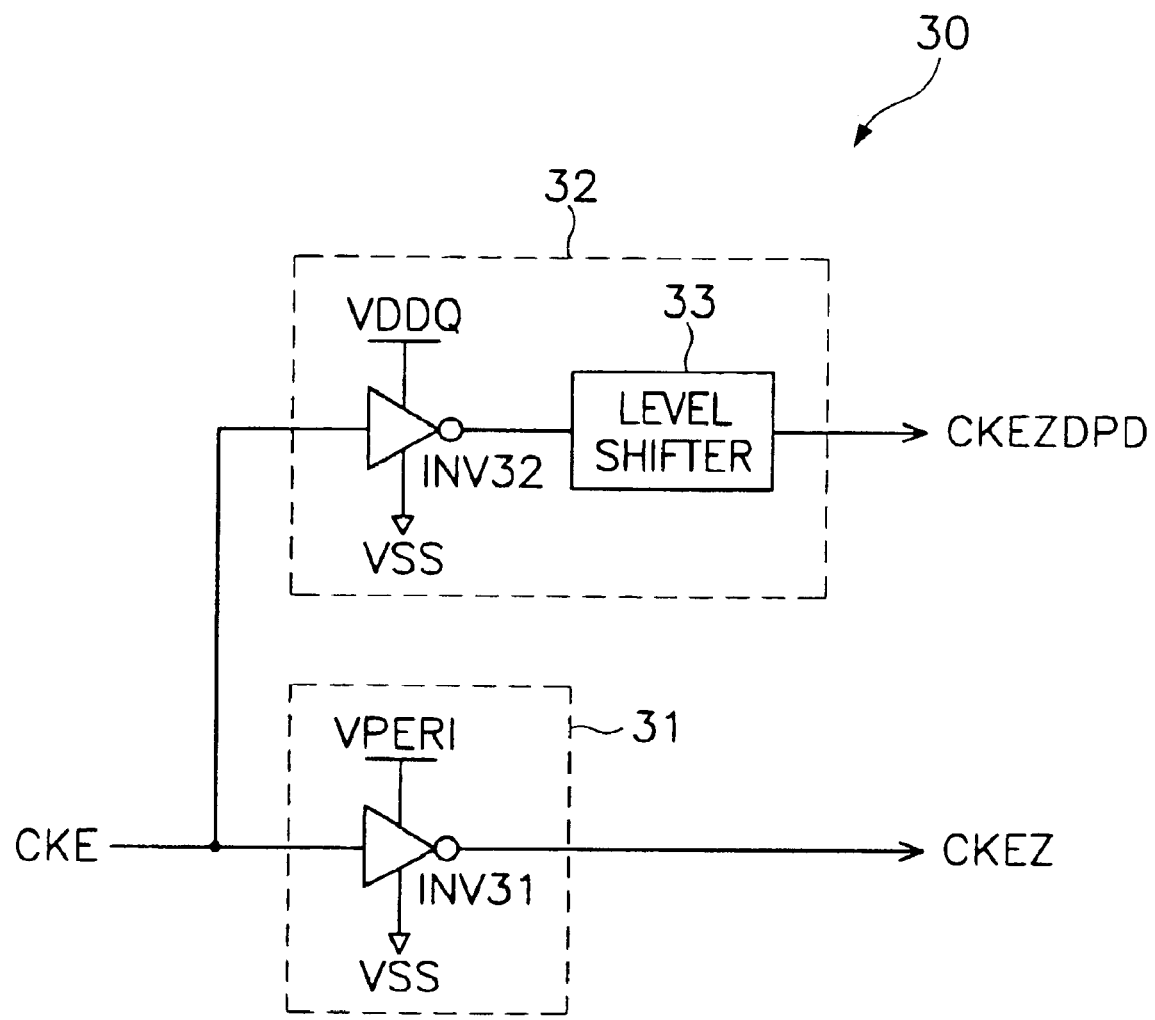
FIG. 3 is a detailed circuit diagram illustrating a CKE buffer of FIG. 1.

As illustrated in FIG. 3, the CKE buffer 30 includes a normal CKE buffer 31 for buffering the clock enable signal CKE in a normal mode, and a deep power down CKE buffer 32 for buffering the clock enable signal CKE in the deep power down mode. The normal CKE buffer 31 has an inverter INV31 driven by an internal power voltage VPERI for outputting a normal clock enable signal CKEZ by driving the clock enable signal CKE.

In addition, the deep power down CKE buffer 32 includes an inverter INV32 for driving the clock enable signal CKE by an output buffer driving voltage VDDQ, and a level shifter 33 for outputting the deep power down clock enable signal CKEZDPD by shifting a level of the output signal from the inverter INV32. The level shifter 33 shifts the level of the deep power down clock enable signal CKEZDPD when the output buffer driving voltage VDDQ is lower than the internal power voltage VPERI. Although the inverter INV32 is driven by the output buffer driving voltage VDDQ, it can also be driven by an external power voltage VDD applied to an external pad.

Figure 4:
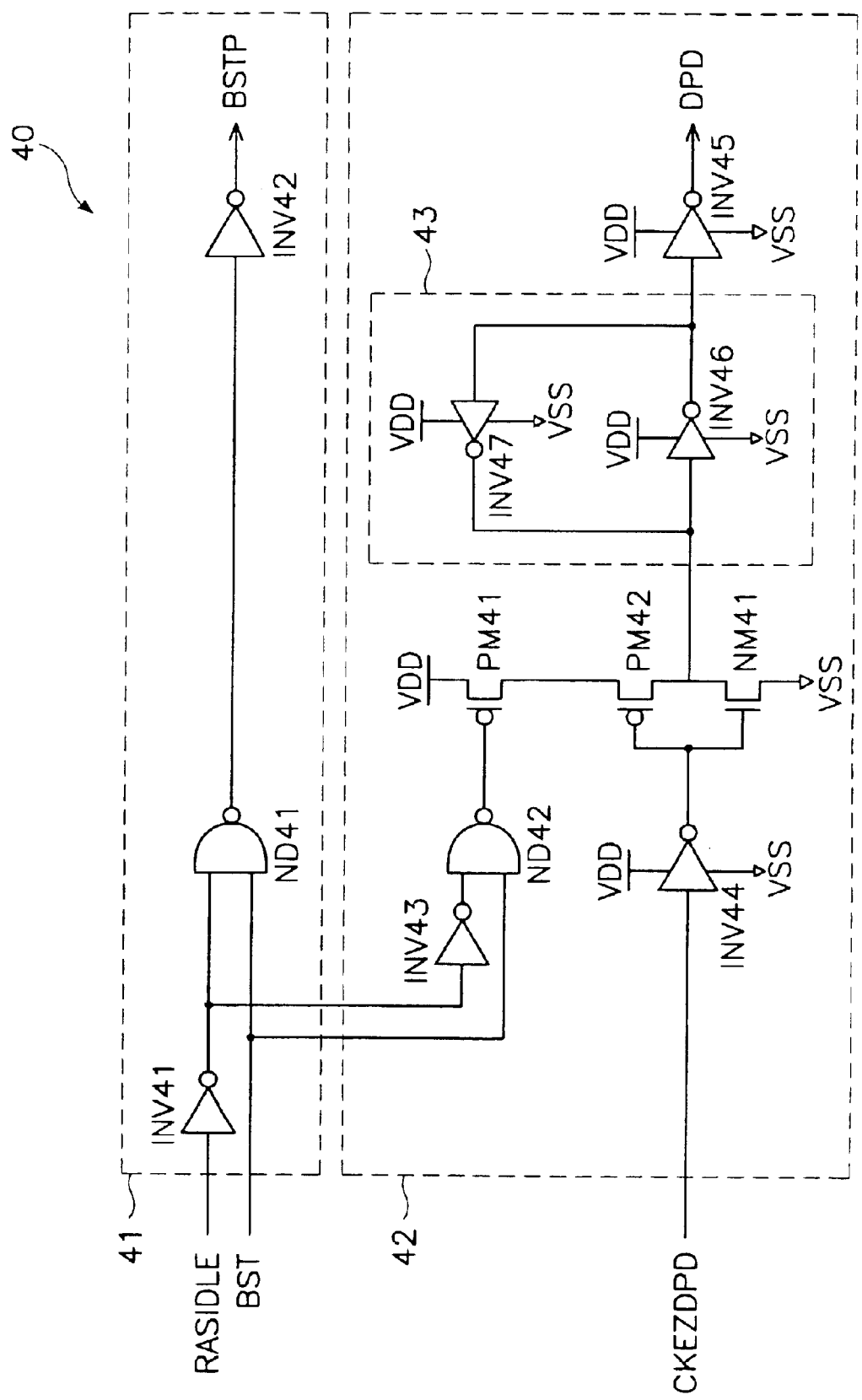
FIG. 4 is a detailed circuit diagram illustrating a deep power down decoder of FIG. 1.

As depicted in FIG. 4, the deep power down decoder 40 includes a burst end signal generating unit 41 to output the burst end signal BSTP in the bank active state, and a deep power down signal generating unit 42 to output the deep power down signal DPD in the bank idle state. The burst end signal generating unit 41 includes an inverter INV41 for inverting the state signal RASIDLE, a NAND gate ND41 for NANDing the output signal from the inverter INV41 and the burst end command BST, and an inverter INV42 for inverting the output signal of the NAND gate ND41 and outputting the burst end signal BSTP.

In addition, the deep power down signal generating unit 42 includes an inverter INV43 for inverting the output signal from the inverter INV41, a NAND gate ND42 for NANDing the signal outputted from the inverter INV43 and the burst end command BST. An inverter INV44 is driven by the external power voltage VDD to invert the deep power down clock enable signal CKEZDPD. The deep power down signal generating unit 40 also includes PMOS transistors PM41 and PM42 and a NMOS transistor NM41 that are connected in series between the external power voltage VDD and a ground voltage VSS. The gate on the PMOS transistor PM41 is connected to receive the output signal from the NAND gate ND42. The gate on the PMOS transistor PM42 is connected to receive the output signal from the inverter INV44. The gate on the NMOS transistor NM41 is connected to receive the signal output from the inverter INV44. A latch unit 43 is included for latching a potential of the common drain of the PMOS transistor PM42 and the NMOS transistor NM41, and an inverter INV45 driven by the external power voltage VDD is also included for inverting the potential latched by the latch unit 43 and outputting the deep power down signal DPD. Here, the latch unit 43 is formed in a reverse latch type having two inverters INV46 and INV47 whose input terminals exchange outputs.

Accordingly, when any of the banks has the active state, namely the state signal RASIDLE is disabled, the burst end signal generating unit 41 generates the burst end signal BSTP according to the inputted burst end command BST. When any of the banks does not have the active state, where the state signal RASIDLE is enabled and the clock enable signal CKE has a low level, the deep power down signal generating unit 42 disables the burst end signal BSTP and enables the deep power down signal DPD in a high level by the inverters INV44, INV45, INV46 and INV47 driven by the external power voltage VDD. Therefore, the semiconductor memory device enters into the deep power down mode.

On the other hand, when the clock enable signal CKE has a high level, the deep power down signal generating unit 42 disables the deep power down signal DPD in a low level, and thus the semiconductor memory device ends the deep power down mode. Here, the deep power down signal controls the deep power down operation of the semiconductor memory device, and can be used for many kinds of circuits to control the deep power down operation in the chip.

Figure 5A:
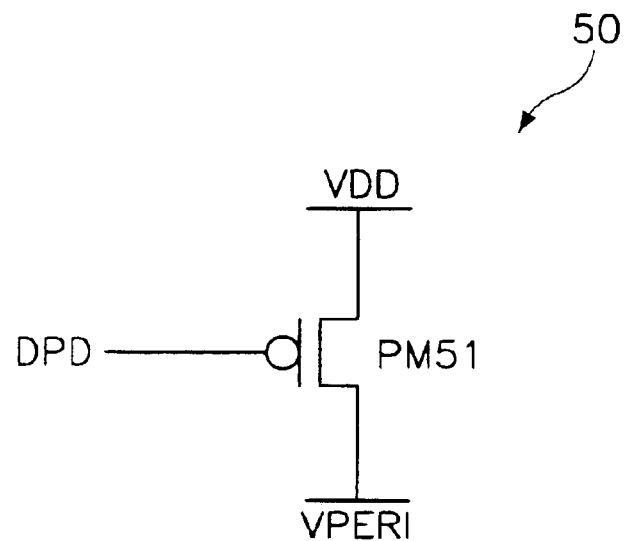
FIGS. 5a and 5b are detailed circuit diagrams illustrating a deep power down switch.

As shown in FIG. 5a, the deep power down switch 50 includes a PMOS transistor PM51 connected between the external power voltage VDD and the internal power voltage VPERI. The PMOS transistor's gate is connected to receive the deep power down signal DPD. Accordingly, when the deep power down signal DPD is enabled in a high level, the PMOS transistor PM51 is turned off to intercept supply of the external power voltage VDD to the internal power voltage VPERI. Here, the internal power voltage VPERI may be a power source for driving the whole chip. That is, it can be a power source for the semiconductor memory device which generates internal power voltages such as, for example, a boosting voltage VPP, a back bias voltage VBB, a bit line precharge voltage VBLP, a cell plate voltage VCP, a reference voltage VREF or an internal driving voltage VINT. In order to control a switching speed of the deep power down switch 50, an RC delay (not shown) can be connected to an input terminal to which the deep power down signal DPD is input.

Figure 5B:
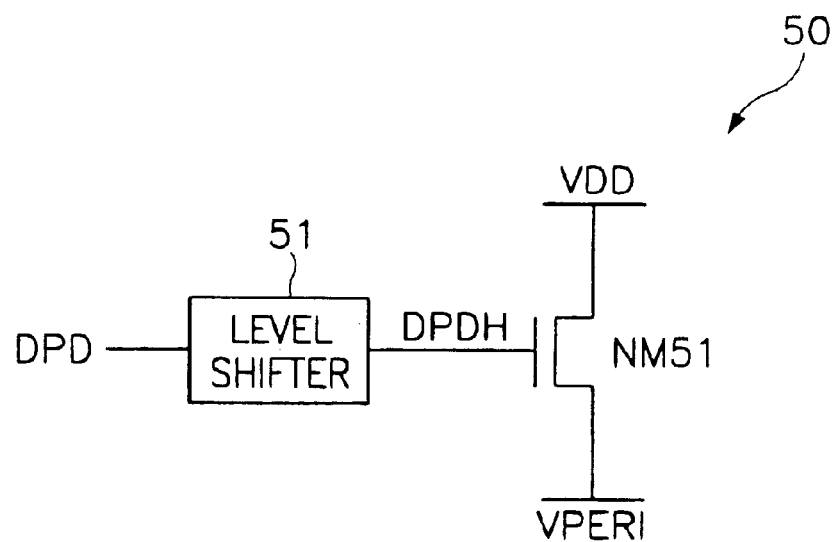

As shown in FIG. 5b, another example of the deep power down switch 50 includes an NMOS transistor NM51 that is connected between the external power voltage VDD and the internal power voltage VPERI, and has its gate connected to receive the signal obtained by level-shifting the deep power down signal DPD by a level shifter 51. The level shifter 51 is connected to use the boosting voltage VPP which is higher than the external power voltage VDD by a threshold voltage to turn on the NMOS transistor NM51.

Figure 6:
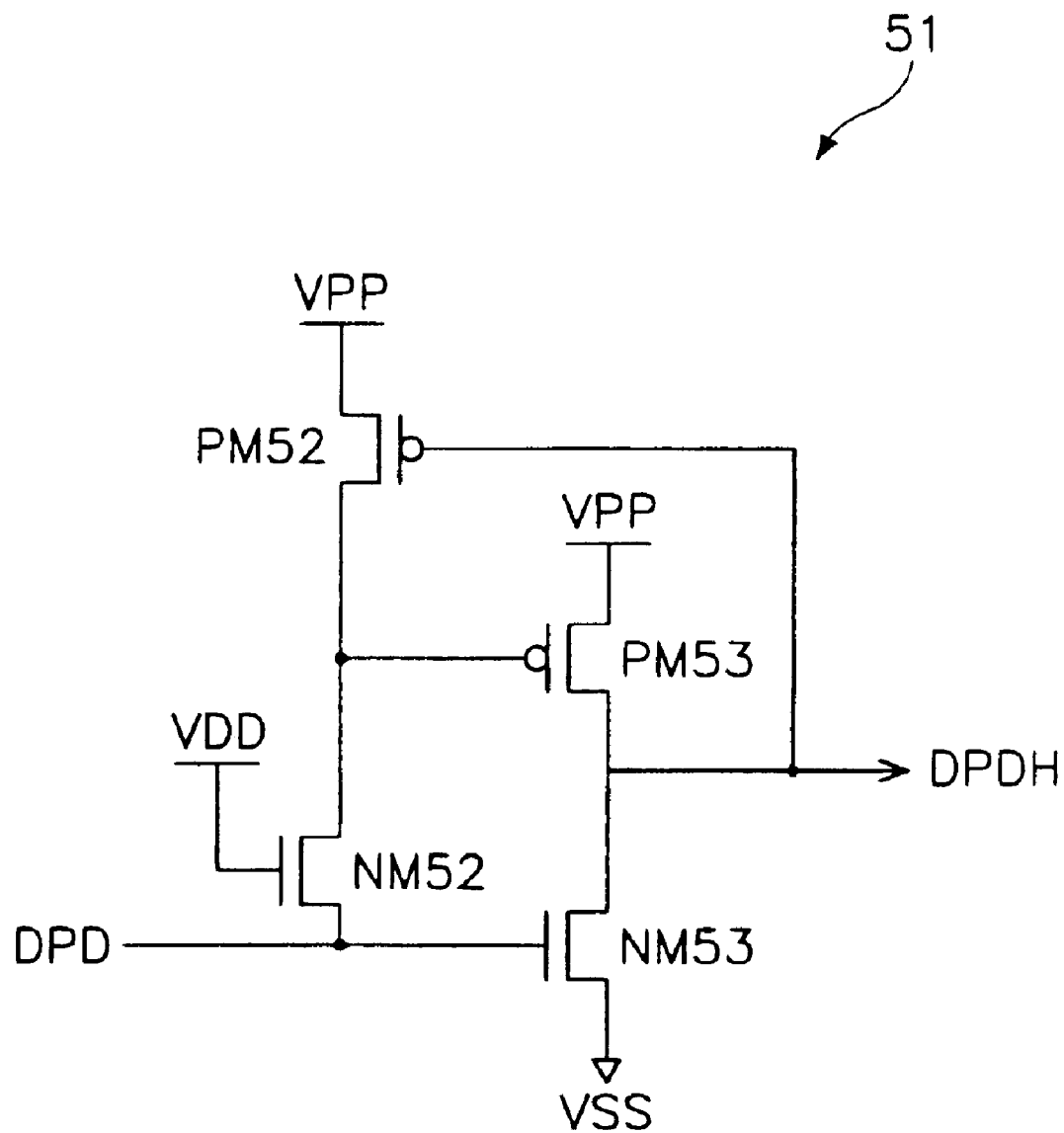
FIG. 6 is a detailed circuit diagram illustrating a level shifter of FIG. 5b.

FIG. 6 illustrates the level shifter 51 and includes a PMOS transistor PM52 that is connected in series between the boosting voltage VPP and the input terminal to which the deep power down signal DPD is inputted. The PMOS transistor's gate is connected to an output terminal. An NMOS transistor NM52 has its gate connected to receive the external power voltage VDD. A PMOS transistor PM53 and an NMOS transistor NM53 are connected in series between the boosting voltage VPP and the ground voltage VSS. The PMOS transistor PM53 has its gate connected to receive a potential of the common drain of the PMOS transistor PM52 and the NMOS transistor NM52. The NMOS transistor NM53 has its gate connected to receive the deep power down signal DPD. A potential of the common drain of the PMOS transistor PM53 and the NMOS transistor NM53 is output as the output signal DPDH. It should be recognized that the level shifter 51 can have a plurality of different designs that perform the same operation as the embodiment shown in FIG. 6.

Figure 7:
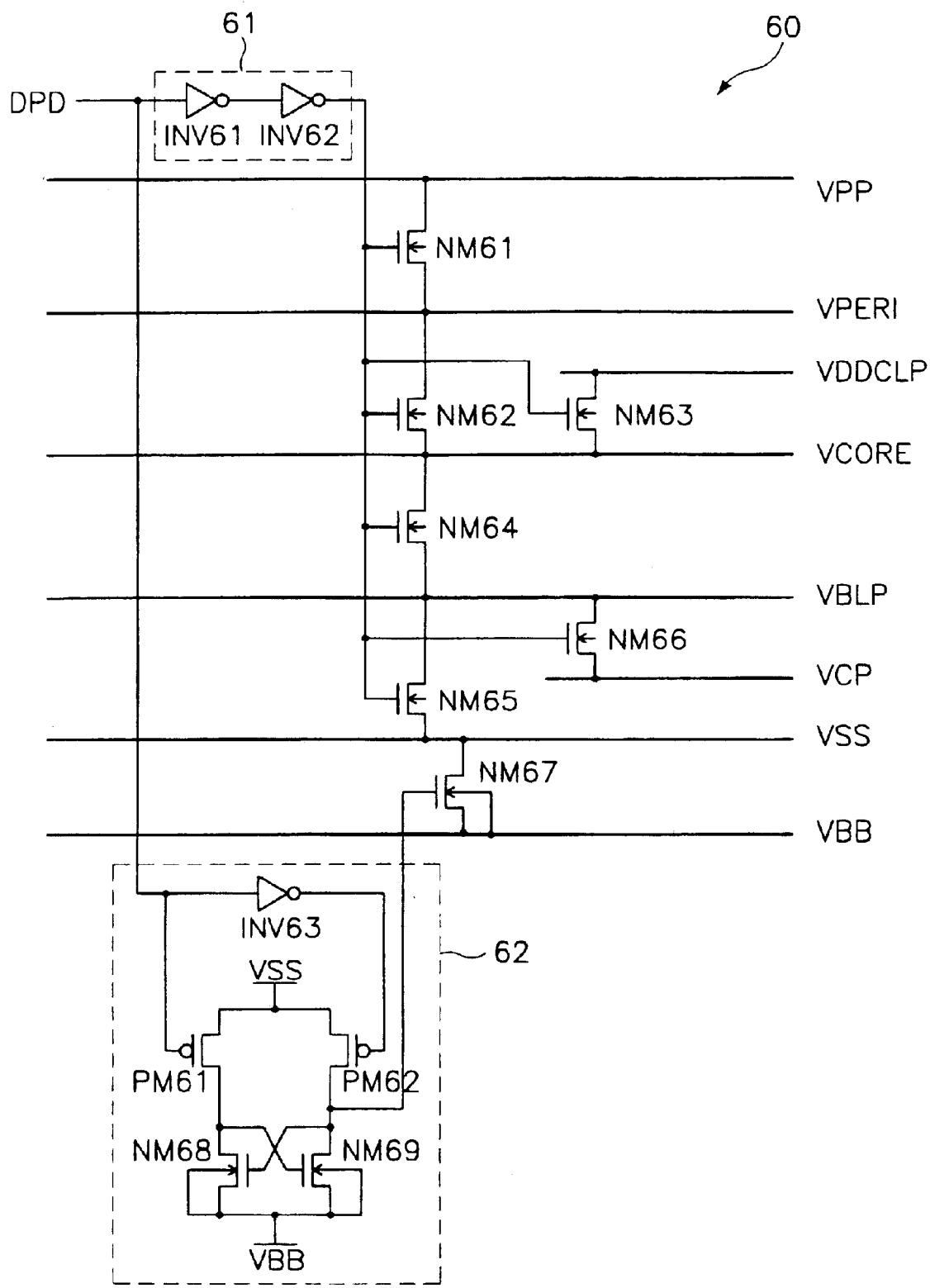
FIG. 7 is a detailed circuit diagram illustrating a deep power down discharge unit of FIG. 1.

As illustrated in FIG. 7, the deep power down discharge unit 60 includes a buffer unit 61 for buffering the deep power down signal DPD, NMOS transistors NM61 to NM67 for connecting all the internal power voltage lines VPP, VPERI, VDDCLP, VCORE, VBLP, VCP and VBB to the ground voltage line VSS, and a level shifter 62 for down-shifting a voltage level of the deep power down signal DPD to turn on the NMOS transistor NM67 for connecting the back bias voltage line VBB to the ground voltage line VSS. The buffer unit 61 includes two inverters INV61 and INV62 connected in series.

The level shifter 62 has an inverter INV63 for inverting the deep power down signal DPD, and PMOS transistors PM61 and PM62 that have their sources commonly connected to the ground voltage VSS and their gates respectively connected to receive the deep power down signal DPD and the signal outputted from the inverter INV63. The level shifter 62 also includes NMOS transistors NM68 and NM69 that have their sources commonly connected to receive the back bias voltage VBB and their gates cross coupled. A potential of the common drain of the PMOS transistor PM62 and the NMOS transistor NM69 is applied to the gate of the NMOS transistor NM67.

In addition, the NMOS transistor NM61 is connected between the boosting voltage VPP and the peripheral circuit driving voltage VPERI and has its gate connected to receive the signal output from the buffer unit 61. When the semiconductor memory device enters into the deep power down mode, the NMOS transistor NM61 is turned on to connect the boosting voltage line VPP to the peripheral circuit driving voltage line VPERI. In the same manner, when the semiconductor memory device enters into the deep power down mode, the other NMOS transistors NM62 to NM67 are turned on to connect the voltage lines connected to their both ends.

The back bias voltage VBB, obtained by down-shifting the ground voltage VSS by the low level shifter 62, is applied to the gate of the NMOS transistor NM67 to connect the back bias voltage line VBB to the ground voltage line VSS. As a result, when the semiconductor memory device enters into the deep power down mode, the deep power down decoder 40 outputs the deep power down signal DPD to separate the external power voltage line VDD from the internal power voltage line VPERI by the deep power down switch 50 to intercept external power, and connects all the internal power voltage lines VPP, VPERI, VDDCLP, VCORE, VBLP, VCP and VBB to the ground voltage line VSS by the NMOS transistors NM61 to NM67 of the deep power down discharge unit 60.

Accordingly, when the semiconductor memory device enters into the deep power down mode and the deep power down switch 50 is turned off to separate the external power voltage line from the internal power voltage line VPERI, the internal power voltage lines VPP, VPERI, VDDCLP, VCORE, VBLP, VCP and VBB have a floating state, thereby preventing mis-operation from being generated due to inversion of the internal power voltages or generation of the latch-up by exit of the deep power down mode or noise.

As discussed earlier, the deep power down control circuit includes the deep power down discharge circuit to connect all the internal power voltage lines to the ground voltage line, and thus prevents floating to remove the possibility of inversion of the power voltage or generation of the latch-up. Moreover, the deep power down control circuit prevents leakage current by the micro bridge among the internal power voltage lines.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A deep power down control circuit comprising:
   a deep power down signal generating unit controlled according to a bank active detect signal and a burst end command, to output a deep power down signal by using a clock enable signal;
   a deep power down switch to separate an external power voltage line from a selected one of a plurality of internal power voltage lines according to the deep power down signal; and
   a deep power down discharge unit to connect and discharge the plurality of internal power voltage lines to a ground voltage level according to the deep power down signal.

2. The circuit according to claim 1, wherein the deep power down switch comprises a MOS transistor connected between the external power voltage line and the selected one of the plurality of internal power voltage lines, the MOS transistor includes a gate configured to receive the deep power down signal.

3. The circuit according to claim 2, wherein the MOS transistor comprises an NMOS transistor having a gate configured to receive a shifter signal obtained by boosting a potential level of the deep power down signal by a high level shifter.

4. The circuit according to claim 1, wherein the deep power down discharge unit comprises a plurality of MOS transistors connected respectively between the plurality of internal power voltage lines, wherein each gate of the plurality of MOS transistors receives the deep power down signal.

5. The circuit according to claim 4, wherein the MOS transistor connected to provide a back bias voltage line to a ground voltage line among the plurality of MOS transistors has its gate connected to receive the signal obtained by down-shifting a potential level of the deep power down signal by a low level shifter.

6. The circuit according to claim 1, wherein the deep power down signal generating unit comprises:
   a state signal generating unit to receive a plurality of bank active signals and generate a state signal that is enabled when all banks are not in an active state;
   a command decoder to generate the burst end command;
   a clock enable signal buffer driven by an internal power voltage in a normal mode to output a normal operation clock enable signal, and driven by an external power voltage in a deep power down mode to output a deep power down clock enable signal by buffering a clock enable signal; and
   a deep power down decoder to output a burst end signal in a bank active state, and to output the deep power down signal by using the state signal and the burst end command and the deep power down clock enable signal from the clock enable signal buffer.

7. The circuit according to claim 6, wherein the state signal generating unit comprises:
   a plurality of NOR gates to NOR the plurality of bank active signals; and
   an AND gate to AND the signals output from the plurality of NOR gates and output the state signal.

8. The circuit according to claim 6, wherein the clock enable signal buffer comprises:
   a first buffer unit, driven by the internal power voltage, to buffer the clock enable signal and output the deep power down clock enable signal; and
   a second buffer unit, driven by the external power voltage, to buffer the clock enable signal and output the normal operation clock enable signal.

9. The circuit according to claim 8, wherein the clock enable signal buffer further comprises a level shifter to boost a potential level of the signal output from the second buffer unit.

10. The circuit according to claim 6, wherein the deep power down decoder comprises:
   a burst end signal generating unit to logically combine the state signal and the burst end command in the bank active state and output the burst end signal; and
   the deep power down signal generating unit controlled according to the signal obtained by logically combining the state signal and the burst end command in the bank idle state, to drive the deep power down clock enable signal and output the deep power down signal.

11. The circuit according to claim 10, wherein the burst end signal generating unit is driven by the internal power voltage and the deep power down signal generating unit is driven by the external power voltage.

12. The circuit according to claim 10, wherein the deep power down decoder further connects a latch unit to an output terminal of the deep power down signal generating unit.

* * * * *